Sept. 20, 1960 E. STANWYCK 2,953,758

ELECTRICAL OR ELECTRONIC COMPONENT

Filed May 29, 1957

Edmund Stanwyck
INVENTOR.

BY Clarence A. O'Brien
and Harvey B. Jacobson
Attorneys

United States Patent Office 2,953,758

Patented Sept. 20, 1960

2,953,758

ELECTRICAL OR ELECTRONIC COMPONENT

Edmund Stanwyck, 75 Carson Ave., Newburgh, N.Y.

Filed May 29, 1957, Ser. No. 662,437

12 Claims. (Cl. 336—65)

This invention relates to a component which is adapted to be used in electronic or electrical circuits, and particularly to a coil assembly that has wide application with modern electronic equipment such as in various types of computers.

An object of the present invention is to provide an inexpensively constructed coil assembly which is capable of being produced at a cost less than present commercially available coils and yet, possesses greater advantages in protection, ease of assembly and ruggedness.

Available coils for computers or like electronic equipments that require magnetic amplifier coils in large quantities, are generally constructed on a base with pigtail leads extending from that base. They must be soldered in the circuit, usually by being mounted on one face of a printed circuit panel. Such coil assemblies are expensive, and considerable care is necessary in soldering the pigtail leads in circuit.

A further object of my invention is to provide a coil which is protected within an envelope so that none of the coil wires are exposed and none are handled during the assembly of the coil in a circuit. This is achieved by having a stem of electrically insulating material, for example plastic such as nylon, polyethylene, polystyrene, etc., and placing the toroidal coil on the stem. But, the stem is of such a dimension that its head fits flush at the top of a cup shaped base and the shank of the stem passes through a hole in the bottom of the base. An envelope is automatically formed in assembling the stem and base in this manner.

Another object of the invention is to provide a new method of assembling coils in protective envelopes. Various problems exist in handling the very small toroidal coils and soldering the leads thereof. One example of the difficulty involved will be understood in considering but one of a large number of different kinds of magnetic amplifier coils that are used in computers. These toroidal coils are approximately a quarter of an inch in diameter and have three separate windings. Therefore there are six leads extending from the three windings on the coils and each of these leads has to be soldered to the circuit formation or an intermediate pigtail lead, clip, etc. between the coil and the circuit formation on a printed circuit panel or other circuitry.

If soldering were the only problem that existed, perhaps, the present practices would be tolerable. However, in precision electronic equipment good solder connections or solderless connections are mandatory. This means that the coil leads have to be stripped completely and entirely so that the coil leads are clean, assuring wetting by the flux or otherwise assuring that there will be good solder connection made. The only really satisfactory way of stripping the very fine wire of the coil leads is by chemical stripping. Then the operator has to be exceedingly careful that none of the stripping liquid will touch the coil on the coil form. Othewise, the insulation will be stripped from the coil and it will be shorted and ruined.

The method of assembly of a coil in accordance with my invention involves the steps of suspending an ordinary coil for example on a stem, and drawing the leads tightly and in one direction and holding these leads in that position. The presence of the stem head functions as a shield during the stripping of the coil leads and therefore, results in the steps of protecting the coil body while holding the leads in a position so that they are all capable of being stripped. Then after stripping, the coil form, its leads and stem are assembled as a unit within a base that is provided with a number of terminals around which the coil leads are wrapped. After wrapping the coil leads around the terminals, the base and stem are rotated a few degrees with respect to each other and in a direction which provides slack in the coil leads between the terminals and the point at which the leads are held in the stem. By bending the terminals over the head of the stem a mechanical connection is established between the stem and the base, after which a thermomechanical junction is made between the terminals and the coil leads. For example, they are soldered. In this condition the coil could be ready for use, but it could also be further protected by a cap fitting down over the top of the base and completely covering and protecting the leads of the coil, leaving only the soldering tabs of the terminals protruding from the bottom of the base.

Other objects and features will become understood in following the description of the illustrated form of the invention.

Figure 1:
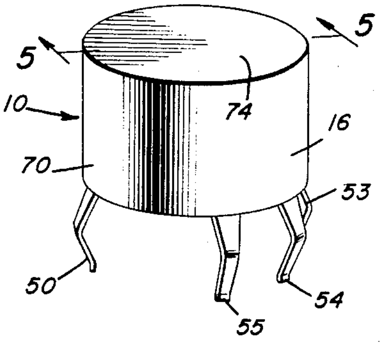
Figure 1 is a perspective view of a coil assembly exemplifying the principles of the invention.
Figure 3:
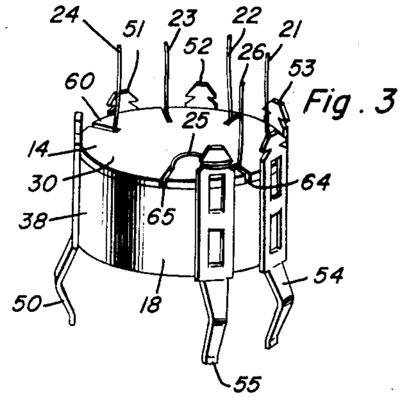
Figure 3 is a perspective view of the stem and base after having been assembled, this view showing the correct orientation of the stem with respect to the base and showing one coil lead wrapped around a binding post formed at the top of one of the terminals of the base. This view represents a step in the process of assembling the coil, which is to be taken after the coil leads have been stripped.
Figure 2:
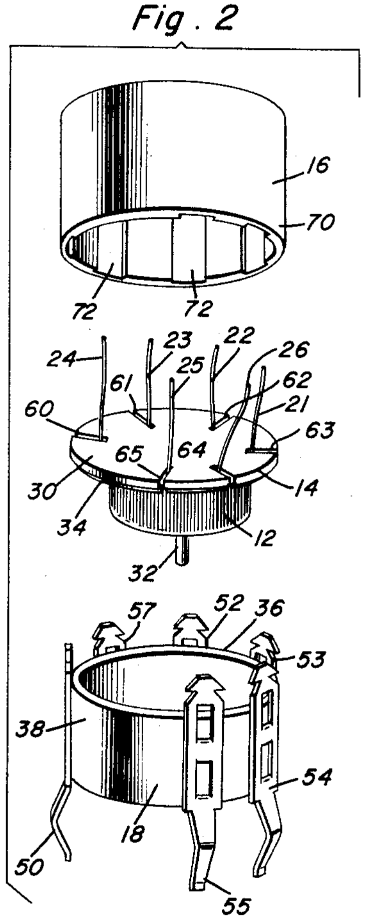
Figure 2 is an exploded perspective view of parts of the assembly of Figure 1.
Figure 4:
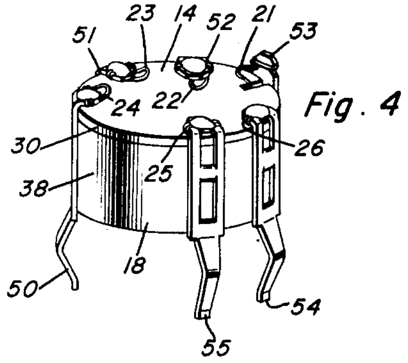
Figure 5:
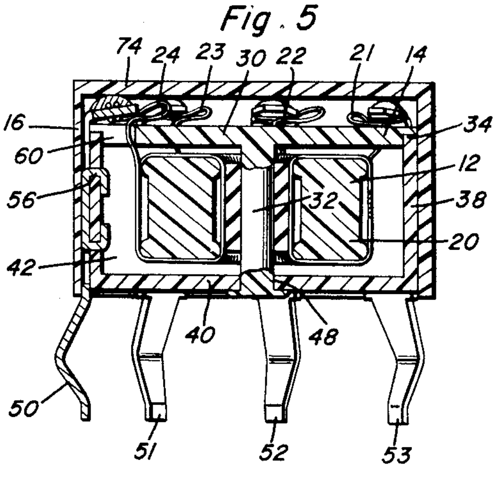

Figure 4 is a perspective view of the assembled stem and base showing the completion of the wrapping steps, the fact that after wrapping each coil lead around its binding post, the stem is indexed so that slack is in the leads, and then the binding posts formed at the upper ends of the terminals are peened or bent over to clinch the base and stem prior to soldering the coil leads to the terminals; and Figure 5 is a sectional view taken on the line 5—5 of Figure 1 and illustrating the completed coil assembly.

The unit 10 is a coil assembly which is constructed in accordance with the invention. A standard coil form 12 is assembled with the stem 14, cap 16 and base 18 in order to construct unit 10. Although different coils may be selected, since computer magnetic amplifiers that are under construction at the present time have need for a tremendous number of small coils with three separate windings, coil 12 is of this type. The three windings on core 20 have leads 21, 22, 23, 24, 25 and 26 respectively extending therefrom.

Stem 14 has a flat head 30 and a shank 32 rising from one of its surfaces and in a plane perpendicular to the plane of the flat head. An annular shoulder 34 is formed in the periphery of head 30 and it seats on the upper edge 36 of base 18.

Base 18 has a cylindrical side wall 38 and a circular bottom wall 40. The top of the base 18 is open while the side wall 38 cooperating with bottom wall 40 forms a cavity 42 in which to accommodate the coil 12. Shank 32 of the stem 14 is passed along a central axis through cavity 42 and a hole 48 in wall 40. This forms an essentially closed chamber with the head of stem 14 functioning as a closure for the cup-shaped base 18. Coil 12 remains captive within the base.

Six terminals 50, 51, 52, 53, 54 and 55 respectively are secured to the side wall 38 of base 18, as by prongs 56 which are formed in pairs intermediate the ends of the terminals. The lower extremities of the terminals constitute solder tabs by which to connect in a printed circuit panel or otherwise attach in other kinds of circuitry. The upper ends of the terminals serve two functions. The first is of a binding post for the coil leads and the second is as a mechanical clamp to hold the stem firmly attached to the base 18. This is achieved by bending the upper ends of the terminals over and onto the head 30 of the stem 14.

Head 30 of stem 14 has six slots 60, 61, 62, 63, 64 and 65 formed on radii of the circular head 30. The six leads of coil 12 are pulled through the slots 60, 61, 62, 63, 64 and 65 and held by friction between the leads and the slots. This is done before the stem is inserted in base 18 so that all the leads are automatically properly positioned after the stem is slipped into the base 18.

Cap 16 has a cylindrical side wall 70, the side wall inner surface containing six grooves 72 in which the sides of terminals 50, 51, 52, 53, 54 and 55 are fitted when the cap has the assembled stem and base fitted in it. The top wall 74 of the cap 16 is brought down on the inwardly bent binding posts of the terminals.

The method in assembling my unit 10 is considered unique. The steps are exemplified in the drawing and although each of the steps may be performed by hand or with the aid of hand tools such as a soldering iron, all steps may be mechanically carried out by machine or certain steps carried out by machine and others by hand.

After acquisition of the correct coil 12, its leads are held and the coil is placed in a protective position prior to chemical stripping the leads 21, 22, 23, 24, 25 and 26. This is done by pulling the six leads through the six slots in the head 30 of stem 14 after slipping the toroidal coil over shank 32. The coil leads are then drawn through a bath of stripping liquid by holding stem 14 in one hand with the leads facing downward toward the path liquid. Due to the tight fit between the leads and the slots in the head 30, the stripping liquid cannot pass head 30 and contact the windings of coil 12. Moreover, the stripping liquid cannot splash on the windings of the coil 12 because the broad surface of head 30 prevents this.

Then, after stripping and drying, stem 14 is disposed in base 18 with shank 32 passing through hole 48 in the bottom wall 40 of base 18. This step, then, involves the encapsulating of the coil with the coil leads only extending from the closed chamber formed by stem 14 and base 18. The slots are on radii of head 30 that are angular from the radii on which the six terminals are disposed. The coil leads are then wrapped around the binding posts formed at the upper ends of the terminals. Thereafter stem 14 is indexed so that the slots become radially aligned with the terminals 50, 51, 52, 53, 54 and 55 and this causes slack in the coil leads between the terminal binding posts and the points in the slots where the coil leads pass through the slots.

The upper ends of the terminals are then bent inwardly and on the upper surface of head 30. This clinches stem 14 within base 18. Secondly, this closes the slots in head 30, these slots being further closed when the coil leads are soldered to the bent binding posts of the six terminals. The slack that had been left in each of the coil leads enables the soldering to be accomplished without the leads being broken or pulled due to dissimilar coefficients of expansion of the material from which the stem and base is made and the terminals.

One of the final steps is for the protection of the solder connections and this is done by slipping the cap 16 over base 18. Thereafter the lower end of stem 32 is adhered to bottom wall 40 of base 18 by the application of heat.

Hole 48 could be used as an entrance for pitch, potting material or any other gas or liquid with which cavity 42 may be filled.

Various modifications, changes and deviations from the described preferred coil assembly and method of making coil assemblies, may be made without departing from the following claims. For example, toroidal coils have any number of windings. For single windings of toroidal coils only two terminals are necessary. Therefore, the number of terminals will vary in accordance with the number of windings on the coil. A further alternative would be to adopt a standard number of terminals and leave certain ones idle. Due to the configuration and construction of the invention, though, an order is easily filled, providing the correct number of terminals for the number of coil windings.

In some cases the toroidal winding may be so tall that the terminals 50, 51, 52, 53, 54 and 55 could not fold over to secure a top. Rather than enlarge the terminals, there is the alternative of having a smaller diameter on base 18 starting from below the wiring point of the terminal binding post. In that case the stem 14 would fit tight at shoulder 34 and the edges sealed by heat spot or by shank 32 heat sealing to the base. If the hole in the base is used for pitching, shoulder 34 should be heat sealed.

What is claimed as new is as follows:

1. A coil assembly comprising a toroidal coil form, a stem having a head and a shank protruding from the head, said toroidal form fitted on said stem, said head having a plurality of slots, said coil being provided with a plurality of coil leads which are passed through said slots and gripped by the walls of the slots so that said head functions as a shield for liquid stripping of the coil leads, a base having a cavity within which said stem and said coil are disposed, said head constituting a closure for said base and fitting on the open end thereof, a plurality of terminals attached to said base and having tabs protruding from one end thereof, and means connecting said coil leads to the other ends of said terminals.

2. A coil assembly comprising a toroidal coil form, a stem having a head and a shank protruding from the head, said toroidal form fitted on said stem, said head having a plurality of slots, said coil being provided with a plurality of coil leads which are passed through said slots and gripped by the walls of the slots so that said head functions as a shield for liquid stripping of the coil leads, a base having a cavity within which said stem and said coil are disposed, said head constituting a closure for said base and fitting on the open end thereof, a plurality of terminals attached to said base and having tabs protruding from one end thereof, means connecting said coil leads to the other ends of said terminals, said connecting means comprising solder junctions, the solder junction ends of said terminals protruding beyond the open end of said base and bent over said head to thereby mechanically clinch said stem within said base.

3. The coil assembly of claim 2 wherein said base has a bottom wall and a side wall, said bottom wall having a hole through which the shank of said stem is passed, and means sealing said shank to said bottom wall around said hole.

4. The coil assembly of claim 2 wherein said base has a side wall to which said terminals are attached, a cap fitted over said junctions and said side wall, said cap having a plurality of grooves in which parts of said terminals are fitted when said cap is placed over said base.

5. In a coil assembly which is constructed of a base having a cavity defined by a side wall and a bottom wall, terminals attached to said side wall and having parts which protrude above the open end of said base, a coil form in said cavity and having leads which protrude from the windings thereon, the improvement comprising a stem that has a head and a shank attached to said head, said shank being passed through said coil form, said head having a plurality of slots and disposed over the open end of said base thereby closing said cavity within which said coil is captive, the coil leads extending through said slots, and the upper ends of said terminals constituting means to which the coil leads are fastened to establish electrical continuity between the windings of the coils and said terminals, and also constituting means by which to fasten said stem within said base.

6. In a coil assembly, the combination of a base which has a cavity, a stem fitted in said cavity, a toroidal coil form carried by said stem and disposed in said cavity, said toroidal coil form having a plurality of leads extending therefrom, said stem having openings through which said leads are passed so that the extremities of said leads are disposed exteriorly of said cavity, a plurality of terminals having binding posts at their ends and located on the exterior of said cavity, said leads having slack therein and attached to said binding posts, mechanical means connecting said leads to said binding posts and the binding posts mechanically fastening said stem to said base.

7. In a coil assembly, a base, a plurality of terminals attached to said base and having binding posts at their ends, a coil form having leads, means including a head for retaining said coil form within said base, said head having openings, said leads extending through said openings and connected with said terminals, and portions of said terminals engaging said head and holding said head mechanically fastened to said base.

8. A coil assembly comprising a base that has a cavity, a coil form having leads, means having openings through which said leads are passed and supporting the coil form within said cavity, terminals attached to said base, binding posts at the extremities of said terminals and to which said leads are secured, and said binding posts contacting said coil supporting means and mechanically holding said coil supporting means fastened to said base.

9. The coil assembly of claim 8 wherein said coil form supporting means comprises a head which constitutes a closure for said base, and a stem protruding from said head and on which the coil form is fastened.

10. The coil assembly of claim 9 wherein said base has a bottom wall provided with a hole in which said shank is fitted, and said hole constituting a filler entrance for a substance to fill the space around the coil form in the base cavity.

11. In an electrical component assembly including an electrical component, the combination of a hollow base having a component cavity, a stem that has a head and a shank, said base having an opening, said head constituting a closure for said opening, said stem constituting means by which to support the electrical component within said cavity, conductive terminals secured to said base, means for connecting said terminals to said electrical component.

12. In an electrical component assembly including an electrical component, the combination of a hollow base having a component cavity, a stem that has a head and a shank, said base having an opening, said head constituting a closure for said opening, said stem constituting means by which to support the electrical component within said cavity, conductive terminals secured to said base, means for connecting said terminals to said electrical component, and a cap covering the last mentioned means and mounted on said base.

References Cited in the file of this patent

UNITED STATES PATENTS

| | | |
|---|---|---|
| 2,483,919 | Mazzola | Oct. 4, 1949 |
| 2,608,610 | Thulin | Aug. 26, 1952 |
| 2,696,659 | McCarty | Dec. 14, 1954 |
| 2,782,386 | Cornell | Feb. 19, 1957 |
| 2,799,836 | Heller et al. | July 16, 1957 |
| 2,807,869 | Rice | Oct. 1, 1957 |
| 2,869,089 | Hampel | Jan. 13, 1959 |